(12) United States Patent
Oota

(10) Patent No.: US 7,968,798 B2
(45) Date of Patent: Jun. 28, 2011

(54) FLEXIBLE PRINTED BOARD

(75) Inventor: Tsutomu Oota, Hyogo (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 901 days.

(21) Appl. No.: 11/936,973

(22) Filed: Nov. 8, 2007

(65) Prior Publication Data

US 2008/0110666 A1   May 15, 2008

(30) Foreign Application Priority Data

Nov. 14, 2006   (JP) .................................. 2006-307933

(51) Int. Cl.
*H05K 1/00* (2006.01)

(52) U.S. Cl. ........................ 174/254; 349/150
(58) Field of Classification Search .................. 174/254, 174/260, 261, 117 F, 117 FF; 349/150
See application file for complete search history.

(56) References Cited

U.S. PATENT DOCUMENTS

| | | | | |
|---|---|---|---|---|
| 6,486,412 B2 * | 11/2002 | Kato | ............................. | 174/260 |
| 6,507,100 B1 * | 1/2003 | Valluri et al. | ................ | 257/697 |
| 6,559,377 B1 * | 5/2003 | Noda et al. | ....................... | 174/36 |
| 7,129,416 B1 * | 10/2006 | Steinfeld et al. | ............... | 174/255 |
| 2006/0109394 A1 * | 5/2006 | Miyagawa et al. | ............. | 349/58 |

FOREIGN PATENT DOCUMENTS

| | | |
|---|---|---|
| JP | 5-41171 | 6/1993 |
| JP | 9-275251 | 10/1997 |
| JP | 11-298094 | 10/1999 |
| JP | 2002-33556 | 1/2002 |
| JP | 2004-88020 | 3/2004 |
| JP | 2006-18134 | 1/2006 |

OTHER PUBLICATIONS

Notice of Submission of Argument issued by the Korean Patent Office on Sep. 14, 2009, for Korean Patent Application No. 10-2007-0115210, and abridged English-language translation thereof.
Notification of Reasons for Refusal issued by the Japanese Patent Office on Dec. 2, 2008, for Japanese Patent Application No. 2006-307933, and English-language translation thereof.

* cited by examiner

*Primary Examiner* — Ishwarbhai B Patel
(74) *Attorney, Agent, or Firm* — Finnegan, Henderson, Farabow, Garrett & Dunner, L.L.P.

(57) ABSTRACT

A base layer of a bent portion of a FPC is formed on the front side thereof with second ground bent lines arranged in a mesh pattern and third ground bent lines intersecting with the second ground bent lines in a lateral direction, and on the back side thereof with first ground bent lines along the bending direction. The first ground bent lines are electrically connected to the second ground bent lines and the third ground bent lines via through holes.

3 Claims, 4 Drawing Sheets

FLEXIBLE PRINTED BOARD

CROSS-REFERENCE TO RELATED APPLICATIONS

This application is based upon and claims the benefit of priority from the prior Japanese Patent Application No. 2006-307933, filed on Nov. 14, 2006; the entire contents of which are incorporated herein by reference.

TECHNICAL FIELD

The present invention relates to a flexible printed board (hereinafter referred simply to as FPC) used for electronic equipment.

BACKGROUND OF THE INVENTION

In recent years, liquid crystal display devices are used for TV receivers, car navigation systems, cellular phones and so on, and a liquid crystal cell of the liquid crystal display device is connected to a printed wiring assembly as a driver by FPC in many cases. In this case, since it is necessary to arrange the printed wiring assembly on the back side of the liquid crystal cell, it is necessary to provide a bent portion at a part of the FPC. Therefore, the FPC is required to have a structure having flexibility and preventing signal lines or ground lines from being broken even at the bent portion.

Therefore, in the related art, FPCs in which a plurality of ground lines and a plurality of signal lines at the bent portion are arranged so as not to oppose to each other with the intermediary of a base layer of the FPC are proposed (for example, JP-A-2004-88020).

The FPCs configured as described above are advantageously flexible, but have a problem such that a countermeasure for reducing radiation of EMI waves from the respective signal lines is not sufficient.

BRIEF SUMMARY OF THE INVENTION

Accordingly, in view of the problem described above, it is an object of the present invention to provide a flexible printed board having durability and flexibility at the bent portion of the FPCs and being devised with a sufficient noise-prevention countermeasure.

According to embodiments of the present invention, there is provided a flexible printed board having two planar portions and a bent portion being positioned therebetween including: a plurality of first signal lines formed on one surface of a base layer of the bent portion and configured to connect the signal lines on the two planer portions; a plurality of first ground lines formed on the one surface of the base layer of the bent portion and configured to connect the ground lines on the two planer portions; a plurality of second ground lines formed on the other surface of the base layer of the bent portion and configured to connect the ground lines on the two planer portions in a diagonal mesh pattern; a plurality of third ground lines configured to connect the plurality of second ground lines and formed in a direction orthogonal to a bending direction of the bent portion; and through holes configured to connect the first ground lines on the one surface of the bent portion and the second ground lines or the third ground lines on the other surface of the bent portion.

According to the embodiments of the invention, an influence of noise is prevented by the provision of the second ground lines and the third ground lines formed into a mesh pattern while maintaining flexibility and durability.

DETAILED DESCRIPTION OF THE INVENTION

Referring now to FIG. 1 to FIG. 4, an FPC 1 according to an embodiment of the invention will be described.

Figure 1:
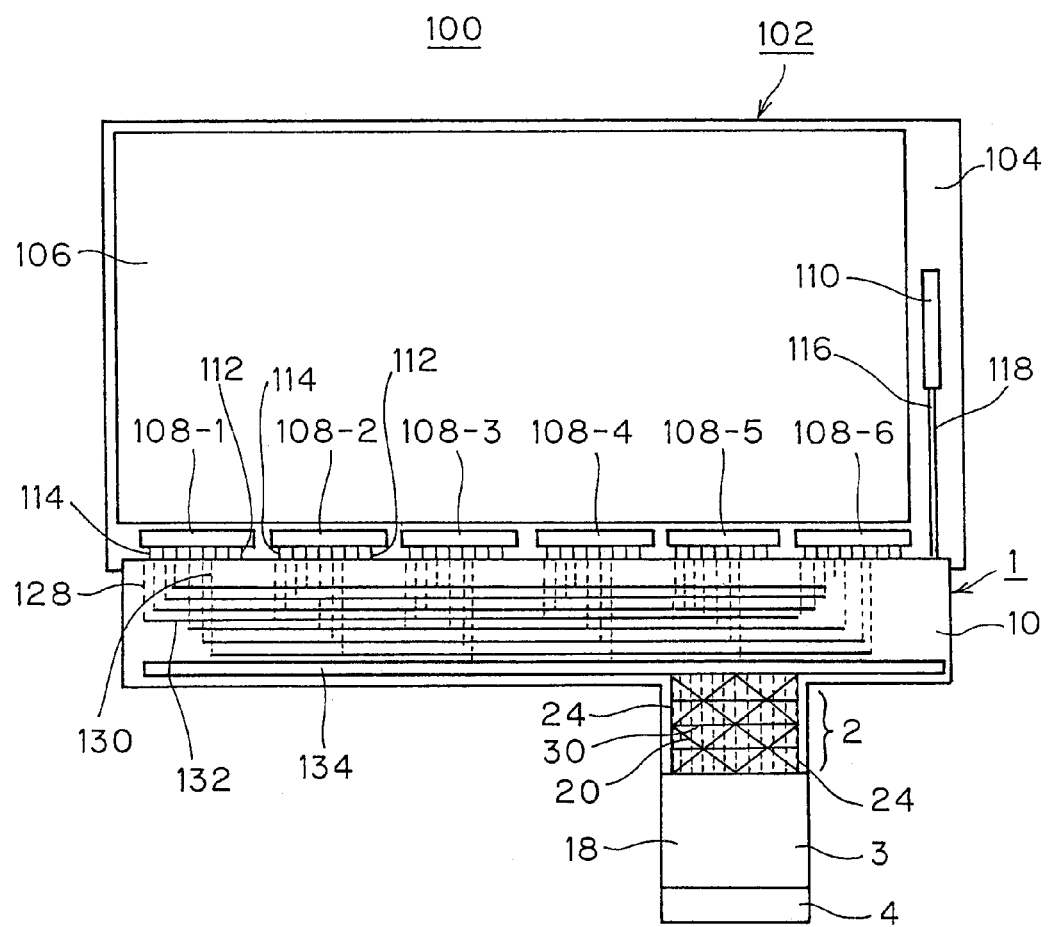
FIG. 1 illustrates a structure of a liquid crystal display device according to an embodiment of the invention.

The FPC 1 in this embodiment is attached to a liquid crystal display device 100 for, for example, a car navigation system, as shown in FIG. 1.

A liquid crystal cell 102 having a size of 5 to 6 inches of the liquid crystal display device 100 includes an array board 104 and an opposed substrate 106 arranged with the intermediary of a liquid crystal layer. The array board 104 is formed with signal line driver circuits 108-1 to 108-6 composed of six IC chips on a shelf portion on the X-side, and a scanning line driver circuit 110 composed of one IC chip on a shelf portion on the Y-side.

A plurality of signal lines 112 and a ground line 114 are drawn from the six signal line driver circuits 108-1 to 108-6, and lands are formed at the distal ends thereof. A plurality of signal lines 116 and a ground line 118 are drawn from the scanning line driver circuit 110 and lands are formed at the distal ends thereof.

The FPC 1 is arranged on the shelf portion of the array board 104 on the X-side. The FPC 1 includes a rectangular FPC main portion 10, and a bent portion 2 projects outward from the FPC main portion 10. An FPC connecting portion 3 is formed so as to continue from the bent portion 2, and an end of the FPC connecting portion 3 corresponds to an FPC reinforcing panel 4.

The FPC main portion 10 is formed with signal branch lines 128 connected to the lands of the signal lines 112 and 116, and ground branch lines 130 connected to the lands of the ground lines 114 and 118 on the back side of the base layer formed of resin in parallel to the direction orthogonal to the longitudinal direction of the FPC 1 at regular intervals.

The base layer of the FPC 1 on the front side thereof is formed with a signal main line 132 to be connected to the respective signal branch lines 128 via through holes. The signal main line 132 is formed in parallel to the longitudinal direction of the FPC 1. A ground main line 134 connected to the respective ground branch lines 130 via through holes is formed in parallel with the signal main line 132.

The base layer of the FPC 1 on the back side thereof is formed with a cover layer which covers the signal branch lines 128 and the ground branch lines 130 and on the front side thereof is formed with a cover layer which covers likewise the signal main line 132 and the ground main line 134.

Figure 2:
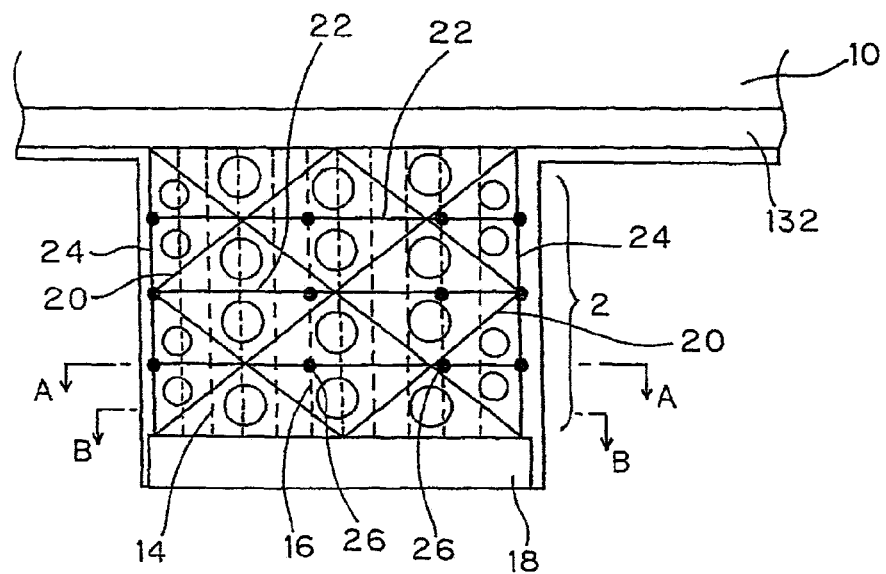
FIG. 2 is an enlarged plane view of a bent portion of an FPC.
Figure 3:
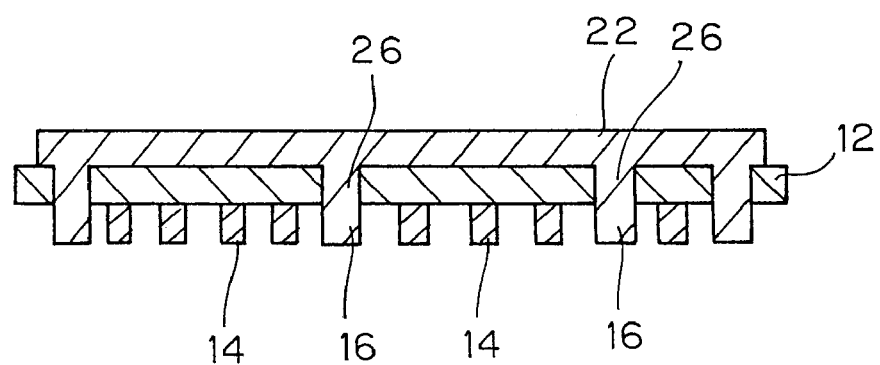
FIG. 3 is a cross-sectional view taken along the line A-A in FIG. 2.
Figure 4:
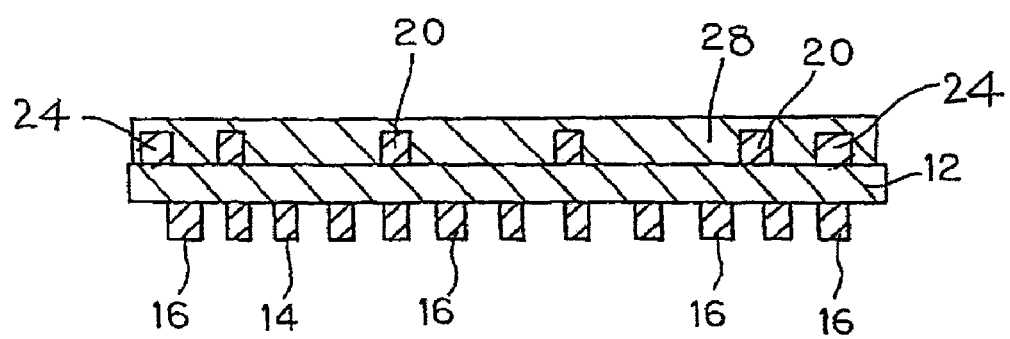
FIG. 4 is a cross-sectional view taken along the line B-B in FIG. 2.

Referring now to FIG. 2 to FIG. 4, the structure of the bent portion 2 will be described.

The bent portion 2 is a portion to be bent for connecting the FPC connecting portion 3 with the print wiring assembly as a driver arranged on the back side of the liquid crystal cell 102.

The base layer 12 of the bent portion 2 on the back side thereof is formed with a plurality of signal bent lines 14 and a plurality of first ground bent lines 16 arranged in parallel to each other along a bending direction at regular intervals. The respective signal bent lines 14 are connected respectively to the aforementioned signal main line 132 and the first ground bent lines 16 are electrically connected to the ground main line 134 through the through holes.

The signal bent lines 14 are connected respectively to signal wirings, not shown, provided on the back side of the base layer of the FPC connecting portion 3, and are connected to the printed wiring board. On the other hand, the first ground bent lines 16 are electrically connected to a planar-shaped ground surface 18 provided on the front side of the base layer of the FPC connecting portion 3 via through holes. The ground surface 18 is connected to the printed wiring board.

The base layer of the bent portion 2 on the front side is formed with second ground bent lines 20 so as to intersect with each other at regular intervals in the oblique directions as shown in FIG. 2. In other words, the second ground bent lines 20 are formed into a mesh pattern. A plurality of third ground bent lines 22 are formed so as to intersect with the second ground bent lines 20 and to be orthogonal to the bending direction. Formed at both ends of the second ground bent lines 20 along the bending direction, that is, on both ends of the third ground bent lines 22 are fourth ground bent lines 24. The second ground bent lines 20, the third ground bent lines 22 and the fourth ground bent lines 24 are electrically connecting the ground main line 134 of the FPC 1 and the ground surface 18 of the FPC connecting portion 3. Through holes 26 are provided at positions where the second ground bent lines 20, the third ground bent lines 22 and the fourth ground bent lines 24 are overlapped with the first ground bent lines 16 provided on the back side of the base layer 12, and are electrically connected to the first ground bent lines 16.

The cover layer 28 on the front side of the bent portion 2 is provided, for example on a circular portion in FIG. 2, which is a portion other than the portion where the second ground bent lines 20, the third ground bent lines 22 and the fourth ground bent lines 24 are provided. Accordingly, the bent portion 2 can be protected.

With the provision of the mesh-patterned second ground bent lines 20 and the third ground bent lines 22 in the direction orthogonal to the bending direction on the bent portion 2 as described above, stress is prevented from concentrating at intersections of the second ground bent lines 20, so that durability is improved.

Since the second ground bent lines 20 are formed into a mesh pattern, the signal bent lines are protected from noise.

Since the first ground bent lines 16, the second ground bent lines 20, the third ground bent lines 22 and the fourth ground bent lines 24 are connected via the through holes 26, the ground is reinforced and is protected further from the noise.

The invention is not limited to the above-described embodiments, and may be modified variously without departing from the scope of the invention.

The liquid crystal display device 100 for the car navigation system has been described in the embodiment shown above, it is also possible to apply the invention to liquid crystal television sets, FPCs used for liquid crystal display devices of cellular phones or other FPCs used for other types of electronic equipment.

What is claimed is:

1. A flexible printed board having two planar portions and a bent portion being positioned therebetween comprising:
   a plurality of first signal lines that is formed on one surface of a base layer of the bent portion and connects the signal lines on the two planar portions;
   a plurality of first ground lines that is formed on the one surface of the base layer of the bent portion and connects the ground lines on the two planar portions;
   a plurality of second ground lines that is formed on the other surface of the base layer of the bent portion and connects the ground lines on the two planar portions in a diagonal mesh pattern;
   a plurality of third ground lines that connects the plurality of second ground lines and is formed in a direction orthogonal to a bending direction of the bent portion; and
   through holes that connect the first ground lines on the one surface of the bent portion to the second ground lines or the third ground lines on the other surface of the bent portion;
   wherein the first signal lines and the first ground lines are formed in parallel to the bending direction of the bent portion.

2. The flexible printed board according to claim 1, further comprising a cover layer that covers the one surface of the bent portion at a portion other than the second ground lines and the third ground lines.

3. The flexible printed board according to claim 1, wherein the flexible printed board connects a liquid crystal cell and a printed wiring assembly as a driver.

* * * * *